US011437433B2

(12) United States Patent
Chen et al.

(10) Patent No.: US 11,437,433 B2
(45) Date of Patent: Sep. 6, 2022

(54) TECHNIQUES FOR MRAM TOP ELECTRODE VIA CONNECTION

(71) Applicant: Taiwan Semiconductor Manufacturing Co., Ltd., Hsin-Chu (TW)

(72) Inventors: Sheng-Chang Chen, Hsinchu County (TW); Harry-Hak-Lay Chuang, Zhubei (TW); Hung Cho Wang, Taipei (TW); Sheng-Huang Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 225 days.

(21) Appl. No.: 16/930,481

(22) Filed: Jul. 16, 2020

(65) Prior Publication Data

US 2020/0350365 A1 Nov. 5, 2020

Related U.S. Application Data

(62) Division of application No. 16/412,714, filed on May 15, 2019, now Pat. No. 10,727,274.
(Continued)

(51) Int. Cl.
*H01L 27/22* (2006.01)
*H01F 10/32* (2006.01)
(Continued)

(52) U.S. Cl.
CPC ....... *H01L 27/228* (2013.01); *H01F 10/3259* (2013.01); *H01F 41/32* (2013.01); *H01L 21/7684* (2013.01); *H01L 21/76802* (2013.01); *H01L 21/76877* (2013.01); *H01L 23/528* (2013.01); *H01L 23/5226* (2013.01);
(Continued)

(58) Field of Classification Search
CPC ............. H01L 27/228; H01L 21/76802; H01L 21/7684; H01L 21/76877; H01L 23/5226; H01L 23/528; H01L 23/5329; H01L 43/02; H01L 43/12; H01L 21/76819; H01L 43/08; H01L 27/222; H01L 21/76895;
(Continued)

(56) References Cited

U.S. PATENT DOCUMENTS 10,727,274 B2 * 7/2020 Chen .................... H01L 23/5329
2005/0248980 A1 11/2005 Han et al.
(Continued)

OTHER PUBLICATIONS

Non-Final Office Action dated Jan. 7, 2020 for U.S. Appl. No. 16/412,714.
(Continued)

*Primary Examiner* — Caleen O Sullivan
(74) *Attorney, Agent, or Firm* — Eschweiler & Potashnik, LLC (57) ABSTRACT

Some embodiments relate to a method for forming a memory device. The method includes forming a first memory cell over a substrate and forming a second memory cell over the substrate. Further, an inter-level dielectric (ILD) layer is formed over the substrate such that the ILD layer comprises sidewalls defining a first trough between the first memory cell and the second memory cell. In addition, a first dielectric layer is formed over the ILD layer and within the first trough.

20 Claims, 10 Drawing Sheets

Related U.S. Application Data (60) Provisional application No. 62/749,197, filed on Oct. 23, 2018.

(51) Int. Cl.
*H01F 41/32* (2006.01)
*H01L 21/768* (2006.01)
*H01L 43/12* (2006.01)
*H01L 23/528* (2006.01)
*H01L 23/522* (2006.01)
*H01L 23/532* (2006.01)
*H01L 43/02* (2006.01)

(52) U.S. Cl.
CPC .......... *H01L 23/5329* (2013.01); *H01L 43/02* (2013.01); *H01L 43/12* (2013.01)

(58) Field of Classification Search
CPC . H01L 23/5386; H01L 43/10; H01F 10/3259; H01F 41/32
USPC .......................................................... 257/427
See application file for complete search history.

(56) References Cited

U.S. PATENT DOCUMENTS

| | | |
|---|---|---|
| 2016/0268499 A1 | 9/2016 | You et al. |
| 2016/0351797 A1 | 12/2016 | Yi et al. |
| 2017/0170386 A1 | 6/2017 | Chuang et al. |
| 2017/0271198 A1 | 9/2017 | Huang et al. |
| 2018/0158869 A1 | 6/2018 | Chuang et al. |
| 2019/0027536 A1 | 1/2019 | Wiegand et al. |
| 2019/0157099 A1 | 5/2019 | Chen et al. |
| 2020/0006425 A1 | 1/2020 | Lin et al. |

OTHER PUBLICATIONS

Notice of Allowance dated Mar. 17, 2020 for U.S. Appl. No. 16/412,714.

* cited by examiner

TECHNIQUES FOR MRAM TOP ELECTRODE VIA CONNECTION

REFERENCE TO RELATED APPLICATIONS

This application is a Divisional of U.S. application Ser. No. 16/412,714, filed on May 15, 2019, which claims the benefit of U.S. Provisional Application No. 62/749,197, filed on Oct. 23, 2018. The contents of the above-referenced patent applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random-access memory (MRAM) cells are generally located within an ILD structure surrounding stacked interconnect layers over a substrate in an embedded memory region. The MRAM cells are generally comprised within an array having a plurality of MRAM cells arranged in rows and columns. The plurality of MRAM cells are separated from each other by a similar distance. A MRAM cell generally includes a magnetic tunnel junction (MTJ) arranged between top and bottom electrodes. The bottom electrode is coupled to the stacked interconnect layers by a bottom electrode via while the top electrode is coupled to the stacked interconnect layers by a top electrode via.

MRAM cells may be fabricated by forming an inter-level dielectric (ILD) over magnetic tunnel junctions (MTJs), followed by a CMP process to provide a flat surface. The top electrode via is subsequently formed by etching the ILD to form an opening over the top electrode of each MRAM cell. The opening is subsequently filled with one or more conductive materials. A CMP process is performed to remove any excess conductive materials forming the top electrode via. A bit-line is disposed over the top electrode via. A bit-line will be disposed over each row of the array of MRAM cells.

It has been appreciated that the topography of the MTJs may cause the ILD to have sidewalls and an upper surface defining a recess between any pair of MRAM cells. The conductive materials used to form the top electrode via may also fill the recess within the ILD layer, so that after performing the CMP process to form the top electrode via there is conductive material in the recess defined by the ILD. Having conductive material at the same level as the top electrode via between MRAM cells in the embedded memory region can cause performance failures. For example, the conductive material within the recess may shorten a distance between adjacent top electrode vias leading to time dependent dielectric breakdown (TDDB) and/or the conductive material within the recess may cause bit-line to bit-line shorting issues between sequential rows of the array of MRAM cells inducing a loss of yield and performance failures.

The present disclosure, in some embodiments, relates to a method of forming a memory device having two or more MRAM cells that do not have any conductive material at an upper level of the top electrode via between respective MRAM cell top electrode vias. The absence of conductive material prevents performance failures in the memory device, due to shorting between sequential bit lines, for example.

Figure 1:
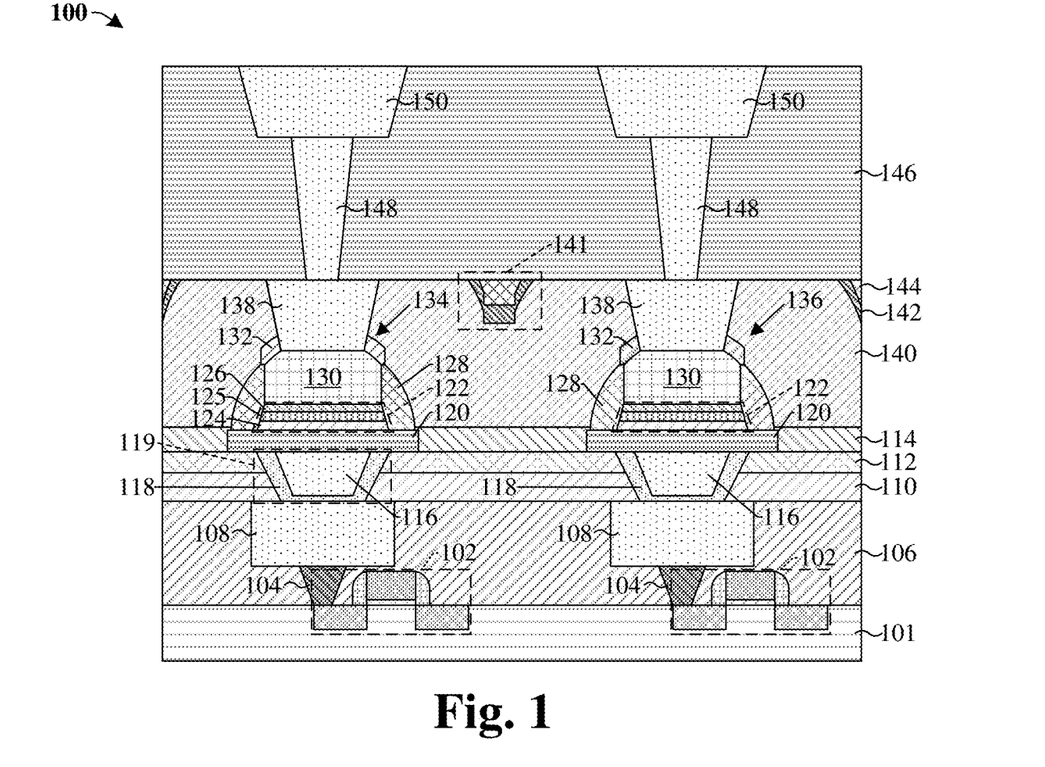
FIG. 1 illustrates a cross-sectional view of some embodiments of a memory device including two MRAM cells respectively having a magnetic tunneling junction (MTJ), according to the present disclosure.

Referring to FIG. 1, a cross-sectional view of a memory device 100 in accordance with some embodiments is provided.

The memory device 100 includes a first inter-level dielectric (ILD) layer 106 disposed over a substrate 101. A plurality of transistors 102 are within the substrate 101 and first ILD layer 106. A first magnetoresistive random-access memory (MRAM) cell 134 is connected to a first one of the plurality of transistors 102 via a conductive contact 104 and an interconnect wire 108. A second MRAM cell 136 is connected to a second one of the plurality of transistors 102 via a conductive contact 104 and an interconnect wire 108.

The first MRAM cell 134 and the second MRAM cell 136 respectively comprise a lower electrode 120 disposed over a bottom electrode via 119 comprising a lower metal layer 116 and a diffusion barrier 118. The diffusion barrier 118 covers the lower metal layer 116. The first MRAM cell 134 and the second MRAM cell 136 further respectively include an upper electrode 130, which is separated from the lower electrode 120 by a magnetic tunnel junction (MTJ) 122. The diffusion barrier 118 and lower metal layer 116 are disposed within a first lower dielectric layer 110 and a second lower dielectric layer 112. In some embodiments, a center of the diffusion barrier 118 and a center of the lower metal layer 116 are aligned with a center of the MTJ 122. The lower electrode 120 is disposed within a third lower dielectric layer 114. A top electrode via 138 is disposed over the upper electrode 130. A first sidewall spacer 128 surrounds the first MRAM cell 134 and the second MRAM cell 136. A second sidewall spacer 132 surrounds a portion of the upper electrode 130 and the top electrode via 138. In some embodiments, the lower electrode 120 and the upper electrode 130 may be comprised of copper, aluminum, titanium, tantalum, or the like. In some embodiments, the bottom electrode 120 may have a thickness within a range of between approximately 50 Angstroms and approximately 500 Angstroms. In some embodiments, the upper electrode 130 may have a thickness within a range of between approximately 100 Angstroms and approximately 600 Angstroms and a width within a range of between approximately 300 Angstroms and approximately 1000 Angstroms.

A second ILD layer 140 surrounds the first MRAM cell 134, the second MRAM cell 136, and the top electrode via 138. The second ILD layer 140 comprises sidewalls defining a trough 141 (e.g., a rhombus trough) between the first MRAM cell 134 and the second MRAM cell 136. In some embodiments, the trough 141 contains one or more dielectric materials. For example, the trough 141 may contain a first upper dielectric layer 142 disposed over a portion of the second ILD layer 140 and/or a second upper dielectric layer 144 disposed over the first upper dielectric layer 142. An upper surface of the second ILD layer 140 defining the trough 141 is in contact with a lower surface of the portion of the first upper dielectric layer 142. In some embodiments, the one or more dielectric materials completely fill the trough 141. In some embodiments, the one or more dielectric materials have a planar upper surface that is aligned with an upper surface of the second ILD layer 140 and that continuously extends between the sidewalls of the second ILD layer 140. In some embodiments, the trough 141 contains no conductive (e.g., metal) materials. Upper surfaces of the one or more dielectric materials and a top surface of the top electrode via 138 are defined by a horizontal line. In some embodiments, the horizontal line is substantially level. The upper surface of the second ILD layer 140 defining the trough 141 is above a top most surface of the first MRAM cell 134 and a top most surface of the second MRAM cell 136. In some embodiments, an uppermost surface of the second ILD layer 140 is below an uppermost surface of the second upper dielectric layer 144.

The MTJ 122 includes a lower ferromagnetic electrode 124 and an upper ferromagnetic electrode 126, which are separated from one another by a tunneling barrier layer 125. In some embodiments, the lower ferromagnetic electrode 124 can have a fixed or "pinned" magnetic orientation, while the upper ferromagnetic electrode 126 has a variable or "free" magnetic orientation, which can be switched between two or more distinct magnetic polarities that each represents a different data state, such as a different binary state. In other implementations, however, the MTJ 122 can be vertically "flipped", such that the lower ferromagnetic electrode 124 has a "free" magnetic orientation, while the upper ferromagnetic electrode 126 has a "pinned" magnetic orientation.

In some embodiments, the upper ferromagnetic electrode 126 comprises iron, cobalt, nickel, iron cobalt, nickel cobalt, cobalt iron boride, iron boride, iron platinum, iron palladium, or the like. In some embodiments, the upper ferromagnetic electrode 126 has a thickness within a range of between approximately 50 Angstroms and approximately 200 Angstroms and a width within a range of between approximately 500 Angstroms and 1300 Angstroms. In some embodiments, the tunneling barrier layer 125 provides electrical isolation between the upper ferromagnetic electrode 126 and the lower ferromagnetic electrode 124, while still allowing electrons to tunnel through the tunneling barrier layer 125 under proper conditions. The tunneling barrier layer 125 may comprise, for example, magnesium oxide (MgO), aluminum oxide (e.g., $Al_2O_3$), nickel oxide, gadolinium oxide, tantalum oxide, molybdenum oxide, titanium oxide, tungsten oxide, or the like. In some embodiments, the tunneling barrier layer 125 has a thickness within a range of between approximately 5 Angstroms and approximately 50 Angstroms and a width within a range of between approximately 500 Angstroms and 1300 Angstroms. In some embodiments, the lower ferromagnetic electrode 127 has a thickness within a range of between approximately 50 Angstroms and approximately 200 Angstroms and a width within a range of between approximately 500 Angstroms and 1300 Angstroms.

A third ILD layer 146 is disposed over the second ILD layer 140, the first upper dielectric layer 142, second upper dielectric layer 144, and top electrode via 138. The top surface of the one or more dielectric materials within the trough 141 are in contact with a bottom surface of the third ILD layer 146. In some embodiments, there is one or more dielectric materials and no metal material from the upper surface of the second ILD layer 140 defining the trough 141 to the bottom surface of the third ILD layer 146. A second conductive via 148 is disposed over the top electrode via 138. In some embodiments, the second conductive via 148 may be comprised of copper or aluminum, for example. A second conductive wire 150 is disposed over the second conductive via 148. In some embodiments, the second conductive wire 150 may be comprised of copper or aluminum, for example. The third ILD layer 146 surrounds the second conductive via 148 and the second conductive wire 150. The second conductive wire 150 extends past sidewalls of the second conductive via 148.

Because the trough 141 contains one or more dielectric material, metal residue from the formation of the top electrode via 138 is unable to fill the trough 141. The absence of metal material between the top electrode via 138 of the first MRAM cell 134 and the top electrode via 138 of the second MRAM cell 136 prevents shorting between bit-lines disposed over the first MRAM cell 134 and the second MRAM cell 136. This will increase the yield of an array of a plurality of MRAM cells where the MRAM cells are arranged in rows and columns and where a bit-line is disposed over each row of the array.

Figure 2:
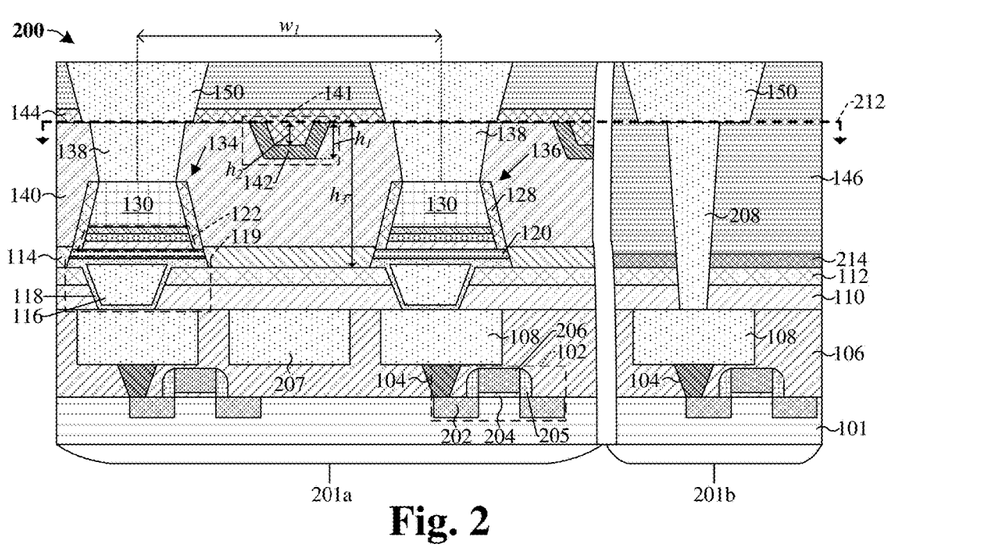
FIG. 2 illustrates a cross-sectional view of some embodiments of a memory device including an embedded memory region comprising two MRAM cells respectively having a magnetic tunneling junction (MTJ) and a logic region, according to the present disclosure.

FIG. 2 illustrates a cross-sectional view of some additional embodiments of a memory device 200.

The memory device 200 comprises an embedded memory region 201a and a logic region 201b. The plurality of transistors 102 are within the substrate 101 and first ILD layer 106. The substrate 101 may be, for example, a bulk substrate (e.g., a bulk silicon substrate) or a silicon-on-insulator (SOI) substrate. The plurality of transistors 102 are respectively comprised of a gate electrode 206, transistor sidewall spacers 205, gate dielectric 204, and source/drain regions 202. An interconnect wire 108 is connected to one of the plurality of transistors 102 via a conductive contact 104. In some embodiments, the interconnect wire 108 may be comprised of copper or aluminum, for example.

The first lower dielectric layer 110 is disposed over the interconnect wire 108 and first ILD layer 106. In some embodiments, the first lower dielectric layer 110 may comprise silicon carbide (SiC), silicon oxycarbide, silicon nitride, silicon oxide, or the like having a thickness within a range of between approximately 150 Angstroms and approximately 350 Angstroms. The second lower dielectric layer 112 is disposed over the first lower dielectric layer 110. In some embodiments, the second lower dielectric layer 112 may comprise silicon rich oxide, silicon oxide, or the like having a thickness within a range of between approximately 100 Angstroms and approximately 300 Angstroms.

In the logic region 201b, a fourth lower dielectric layer 214 is disposed over the second lower dielectric layer 112. In some embodiments, the fourth lower dielectric layer 214 may comprise tetra-ethyl-ortho-silicate (TEOS), (e.g., plasma enhanced TEOS, low particle TEOS, etc.), an oxide (e.g., silicon oxide, silicon dioxide, etc.), a nitride, or the like. In some embodiments, the fourth lower dielectric layer 214 may have a thickness within a range of between approximately 50 Angstroms and approximately 250 Angstroms. A first conductive via 208 is disposed over the interconnect wire 108 within the logic region 201b. In some embodiments, the first conductive via 208 may be comprised of copper or aluminum, for example. A second conductive wire 150 is disposed over the first conductive via 208. In some embodiments, the second conductive wire 150 may be comprised of copper or aluminum, for example. The third ILD layer 146 surrounds the first conductive via 208 and the second conductive wire 150. In some embodiments, the third ILD layer 146 may comprise a low-k dielectric, silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. The second conductive wire 150 extends past sidewalls of the first conductive via 208.

In the embedded memory region 201a, the third lower dielectric layer 114 is disposed over the second lower dielectric layer 112. In some embodiments, the third lower dielectric layer 114 has a larger thickness than the fourth lower dielectric layer 214. In some embodiments, the third lower dielectric layer 114 may comprise silicon oxycarbide (SiOC), silicon carbide, silicon nitride, silicon oxide, or the like. In some embodiments, the third lower dielectric layer 114 may have a thickness within a range of between approximately 200 Angstroms and approximately 400 Angstroms.

A bottom electrode via 119 is arranged over the interconnect wire 108. The bottom electrode via 119 comprises a diffusion barrier 118 and a lower metal layer 116. In some embodiments, the bottom electrode via 119 has a thickness within a range of between approximately 300 Angstroms and approximately 1100 Angstroms and a width within a range of between approximately 200 Angstroms and approximately 1900 Angstroms. The diffusion barrier 118 contacts sidewalls of the lower metal layer 116, a lower surface of the lower metal layer 116, and a top surface of the lower metal layer 116. A top surface of the diffusion barrier 118 is above a top surface of the second lower dielectric layer 112. The top surface of the diffusion barrier 118 is in direct contact with a bottom surface of the lower electrode 120. In some embodiments, a center of the diffusion barrier 118 and a center of the lower metal layer 116 are offset to the left or right of the center of the MTJ 122. In some embodiments, a conductive element 207 (e.g., a sub-resolution assist feature (SRAF)) is disposed between the interconnect wire 108 disposed below the first MRAM cell 134 and the interconnect wire 108 disposed below the second MRAM cell 136. In some embodiments, the trough 141 is directly above the conductive element 207 and outer sidewalls of the conductive element 207 extend past sidewalls of the trough 141.

The second ILD layer 140 is disposed over the third lower dielectric layer 114, the first MRAM cell 134 and the second MRAM cell 136. In some embodiments, the second ILD layer 140 may comprise a low-k dielectric, silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In some embodiments, the second ILD layer 140 may have a thickness within a range of between approximately 700 Angstroms and approximately 1300 Angstroms. The first upper dielectric layer 142 is disposed over the second ILD layer 140. In some embodiments, the first upper dielectric layer 142 may comprise silicon oxynitride (SiON), silicon carbide, silicon nitride, silicon oxide, or the like. In some embodiments, the first upper dielectric layer 142 may have a thickness within a range of between approximately 100 Angstroms and approximately 300 Angstroms. The second upper dielectric layer 144 is disposed over the first upper dielectric layer 142 and the second ILD layer 140. In some embodiments, the second upper dielectric layer 144 may comprise tetra-ethyl-ortho-silicate (TEOS), (e.g., plasma enhanced TEOS, low particle TEOS, etc.), an oxide (e.g., silicon oxide, silicon dioxide, etc.), a nitride, or the like. In some embodiments, the second upper dielectric layer 144 may have a thickness within a range of between approximately 100 Angstroms and approximately 500 Angstroms. In some embodiments, the second upper dielectric layer 144 comprises a protrusion that extends into the trough 141 within the second ILD layer 140.

The third ILD layer 146 is disposed over the second upper dielectric layer 144. A second conductive wire 150 is disposed over the top electrode via 138. In some embodiments, the second conductive wire 150 may be comprised of copper or aluminum, for example. The third ILD layer 146 surrounds the second conductive wire 150. The second conductive wire 150 extends past sidewalls of the top electrode via 138. In some embodiments, the top electrode via 138 may be comprised of copper, aluminum, titanium, tantalum, or the like. In some embodiments, the top electrode via 138 may have a thickness within a range of between approximately 300 Angstroms and approximately 950 Angstroms and a width within a range of between approximately 250 Angstroms and approximately 1300 Angstroms.

A dashed line 212 is aligned with an upper surface of the second ILD layer 140 within the embedded memory region 201a. Within the logic region 201b, the dashed 212 line crosses through the first conductive via 208 and the third ILD layer 146.

A height $h_1$ is defined between a bottom surface of the first upper dielectric layer 142 within the trough 141 and a top surface of the second ILD layer 140. The height $h_1$ is within a range of approximately 5 Angstroms and 75 Angstroms. A width of the first upper dielectric layer 142 within the trough 141 is within a range of approximately 50 Angstroms and approximately 250 Angstroms. A height $h_2$ is defined between a bottom surface of the second upper dielectric layer 144 within the trough 141 and the top surface of the second ILD layer 140. The height $h_2$ is within a range of approximately 1 Angstrom and 40 Angstroms. A width of the second upper dielectric layer 144 within the trough 141 is within a range of approximately 20 Angstroms and approximately 150 Angstroms. A height $h_3$ is defined between a bottom surface of the third lower dielectric layer 114 and the top surface of the second ILD layer 140. The height $h_3$ is within a range of approximately 800 Angstroms and 1800 Angstroms. A width $w_1$ is defined between a center of the upper electrode 130 of the MRAM cell 134 and a center of the upper electrode 130 of the MRAM cell 136. The width $w_1$ is within a range of approximately 2500 Angstroms and 6000 Angstroms.

Figure 3A:
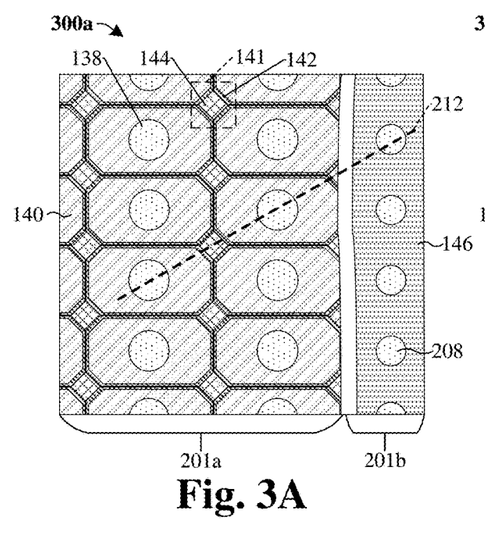
FIGS. 3A-3B illustrates top views of some embodiments of a memory device including an embedded memory region comprising two MRAM cells and a logic region, according to the present disclosure.

FIG. 3A illustrates a top view of some additional embodiments of a memory device 300a.

The memory device 300a comprises an embedded memory region 201a and a logic region 201b. The dashed line 212 from FIG. 2 shows the location of the top view cut. The embedded memory region 201a comprises an array of MRAM cells arranged in rows and columns. It will be appreciated memory arrays can include any number of MRAM cell pairs and thus FIG. 3A is merely an example. The top electrode via 138 is centered between four troughs 141. The trough 141 is filled with the first upper dielectric layer 142 and the second upper dielectric layer 144. The second upper dielectric layer 144 is separated from the second ILD layer 140 by the first upper dielectric layer 142. The first upper dielectric layer 142 extends continuously between respective columns and rows of the array. The second upper dielectric layer 144 also extends continuously on a top surface of the dashed line 212 between respective columns and rows of the array. A bottom surface of the second upper dielectric layer 144 comprises a protrusion, a bottom surface of the protrusion directly contacts an upper surface of the first upper dielectric layer 142 defining the trough 141.

Figure 3B:
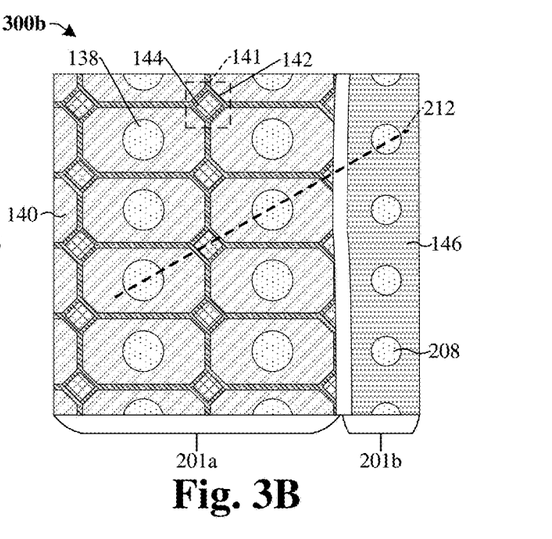

FIG. 3B illustrates a top view of some additional embodiments of a memory device 300b.

The memory device 300b comprises an embedded memory region 201a and a logic region 201b. The dashed line 212 from FIG. 2 shows the location of the top view cut. The embedded memory region 201a comprises an array of MRAM cells arranged in rows and columns. It will be appreciated memory arrays can include any number of MRAM cell pairs and thus FIG. 3b is merely an example. The first upper dielectric layer 142 extends continuously on a top surface of the dashed line 212 between respective columns and rows of the array. The second upper dielectric layer 144 comprises discrete segments separated from one another in a first direction and in a second direction perpendicular to the first direction.

FIGS. 4-14 illustrate cross-sectional views 400-1400 of some embodiments of a method of forming a memory device including an embedded memory region comprising a pair of MRAM cells, and a logic region according to the present disclosure. Although the cross-sectional views 400-1400 shown in FIGS. 4-14 are described with reference to a method, it will be appreciated that the structures shown in FIGS. 4-14 are not limited to the method but rather may stand alone separate of the method. Although FIGS. 4-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
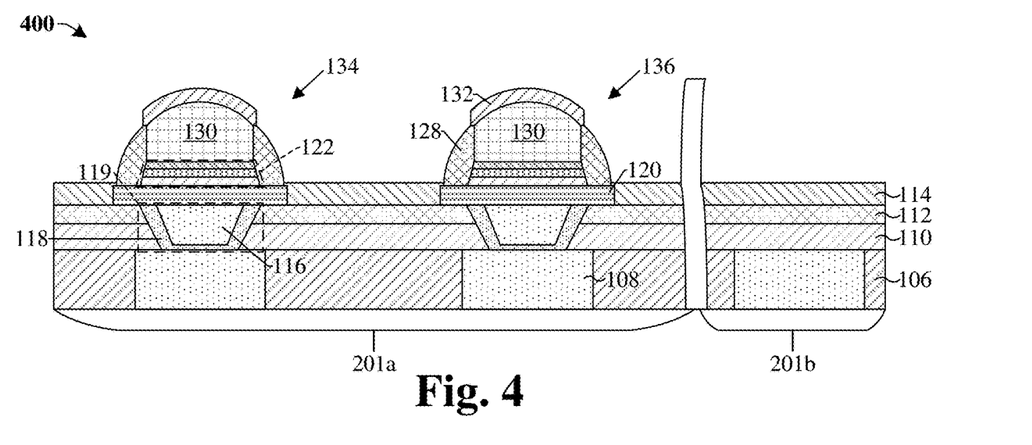
FIGS. 4-14 illustrate cross-sectional and/or top views of some embodiments of a method of forming a memory device including an embedded memory region comprising two MRAM cells respectively having a MTJ and a logic region, according to the present disclosure.

As shown in cross-sectional view 400 of FIG. 4, a first lower dielectric layer 110 is formed over an interconnect wire 108 and first ILD layer 106 over a substrate (not shown). In some embodiments, the first lower dielectric layer 110 may comprise a silicon carbide (SiC) layer. A second lower dielectric layer 112 is formed over the first lower dielectric layer 110. In some embodiments, the second lower dielectric layer 112 may comprise a silicon rich oxide layer. A bottom electrode via 119 comprising a diffusion barrier 118 and a lower metal layer 116 are formed within the first lower dielectric layer 110 and the second lower dielectric layer 112. A third lower dielectric layer 114 is formed over the second lower dielectric layer 112. In some embodiments, the third lower dielectric layer 114 may comprise a silicon oxycarbide (SiOC) layer.

Within the embedded memory region 201a, a first MRAM cell 134 and a second MRAM cell 136 are respectively formed over the interconnect wire 108. The first MRAM cell 134 and the second MRAM cell 136 respectively comprise a lower electrode 120 formed over the diffusion barrier 118 and the lower metal layer 116. The first MRAM cell 134 and second MRAM cell 136 further respectively include an upper electrode 130, which is separated from the lower electrode 120 by a magnetic tunnel junction (MTJ) 122. A first sidewall spacer 128 is formed along sidewalls of the first MRAM cell 134 and second MRAM cell 136. A second sidewall spacer 132 is formed to surround a top surface of the upper electrode 130.

Figure 5:
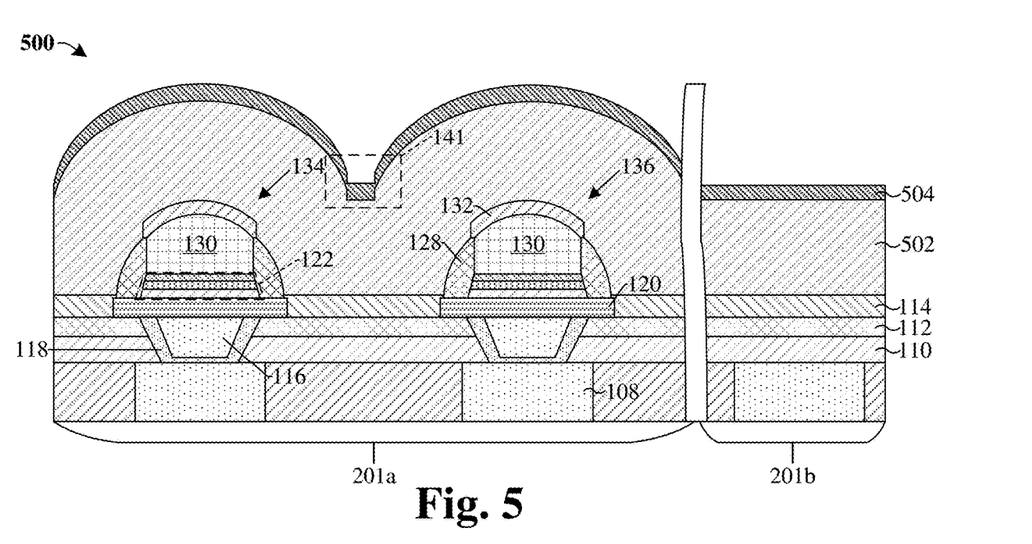

As shown in cross-sectional view 500 of FIG. 5, a second ILD layer 502 is formed over the embedded memory region 201a and the logic region 201b. In some embodiments, the second ILD layer 502 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. Because of the topography of the first MRAM cell 134 and the second MRAM cell 136, the second ILD layer 502 comprises sidewalls and a bottom surface that define a trough 141 between the first MRAM cell 134 and the second MRAM cell 136. In some embodiments, an upper surface of the second ILD layer 502 defining the trough 141 is above an uppermost surface of the first MRAM cell 134 and the second MRAM cell 136. A first dielectric 504 is formed over the second ILD layer 502. In some embodiments, the first dielectric 504 may comprise a silicon oxynitride (SiON) layer, for example. The first dielectric 504 fills a portion of the trough 141. A bottom surface of the first dielectric 504 directly contacts an upper surface of the second ILD layer 502 defining the trough 141. In some embodiments, the second ILD layer 502 is formed to a thickness of 800 Angstroms or in a range of approximately 650 Angstroms and 950 Angstroms. In some embodiments, the first dielectric 504 is formed to a thickness of 200 Angstroms or in a range of approximately 150 Angstroms and 250 Angstroms.

Figure 6A:
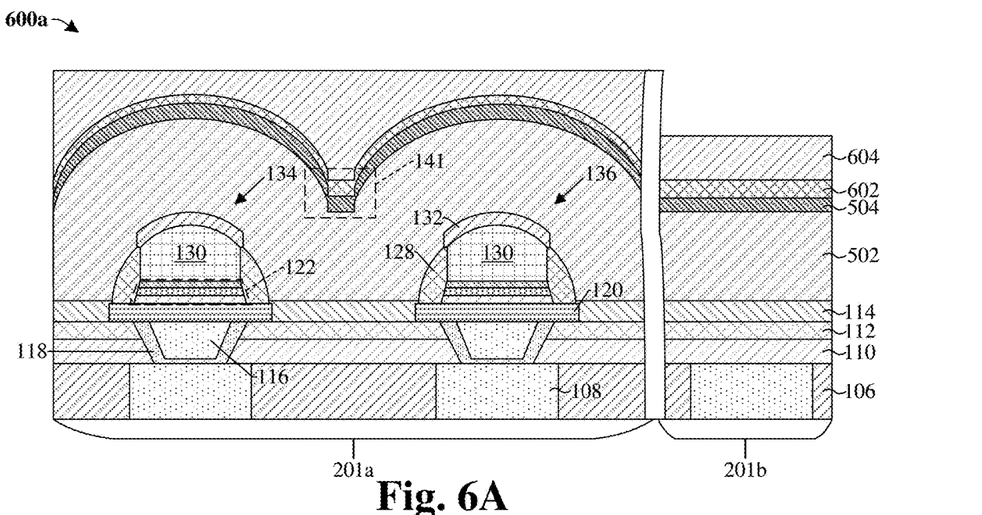
Figure 6B:
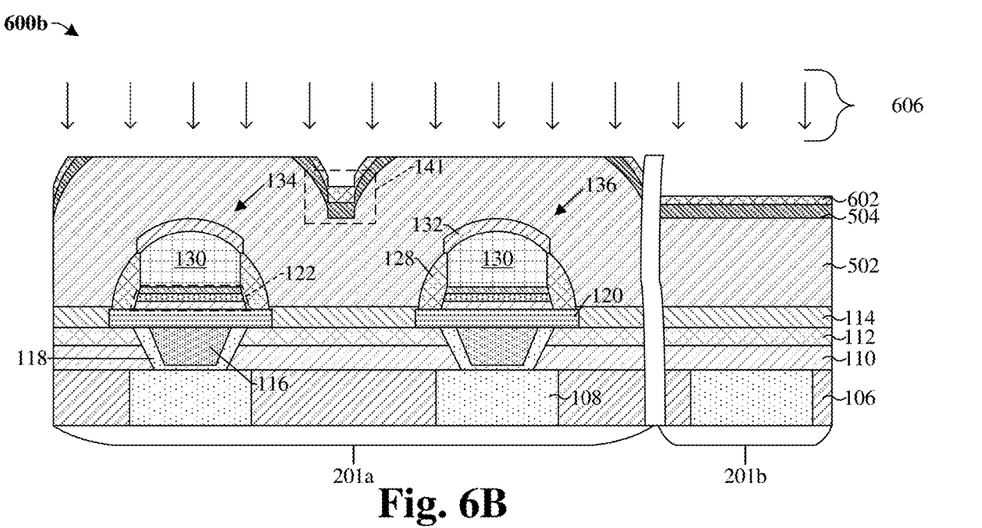
Figure 6C:
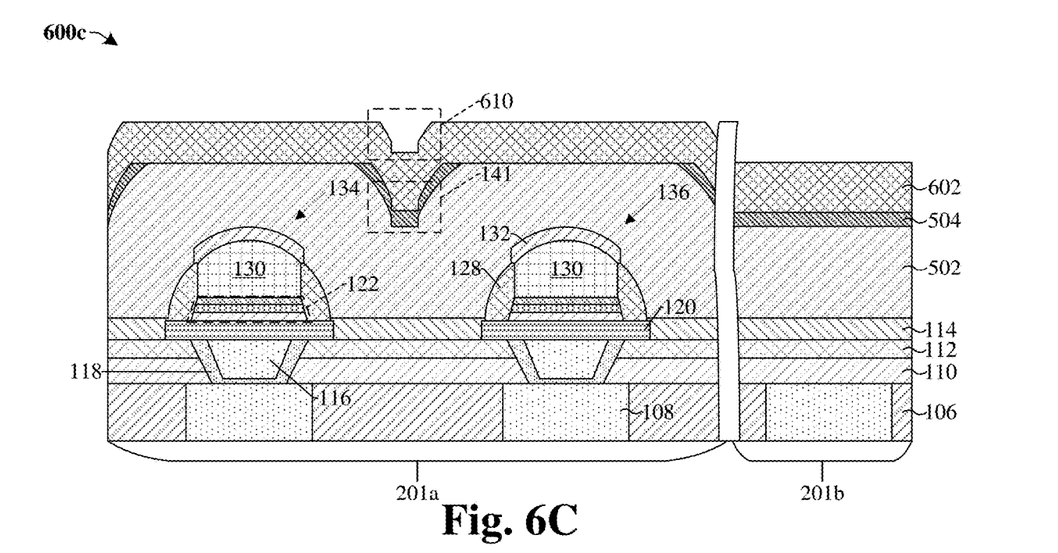
Figure 7A:
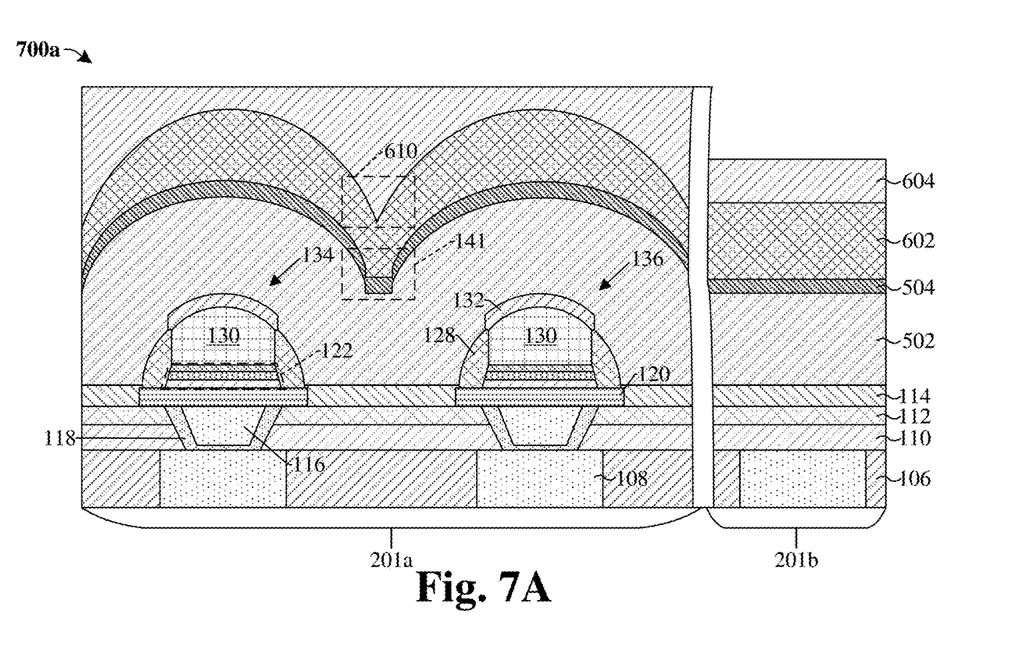
Figure 7B:
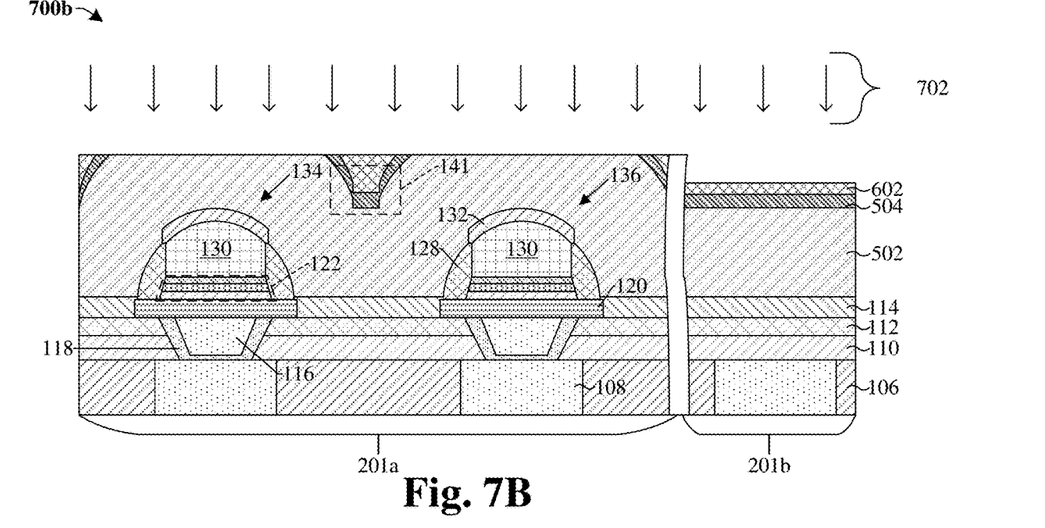

FIGS. 6A-6C illustrate cross-sectional views 600a-600c showing a first embodiment of the method. FIGS. 7A-7B illustrates cross-sectional views 700a-700b corresponding to an alternative, second embodiment of the method.

As shown in cross-sectional view 600a, a second dielectric 602 is formed over the first dielectric 504. In some embodiments, the second dielectric 602 may comprise a tetra-ethyl-ortho-silicate (TEOS) layer formed to a thickness of 150 Angstroms, 200 Angstroms, or within a range of between approximately 150 Angstroms and approximately 250 Angstroms. The second dielectric 602 fills a portion of the trough 141. A planarization layer 604 is formed over the second dielectric 602. The planarization layer 604 fills the remaining open space in the trough 141. In some embodiments, the planarization layer 604 may comprise an anti-reflective coating (ARC). In some embodiments, the planarization layer 604 is formed to a thickness of 880 Angstroms or in a range of approximately 700 Angstroms and 1100 Angstroms.

As shown in cross-sectional view 600b of FIG. 6B, an etching process is performed to etch the second ILD layer 502, the first dielectric 504, the second dielectric 602, and the planarization layer 604. In some embodiments, the planarization layer 604 may have a different etching selectivity than the first dielectric 504 and/or the second dielectric 602, so that the etching process recesses the planarization layer 604 below tops of the first dielectric 504 and/or the second dielectric 602. In some embodiments, the etching process may completely remove the planarization layer 604 from the embedded memory region 201a and logic region 201b. In other embodiments, a separate etching process may be performed to remove the planarization layer 604 from the embedded memory region 201a and logic region 201b. In some embodiments, the etching process reduces a thickness of the second dielectric 602, so that the second dielectric 602 has a thickness of 50 Angstroms or within a range of between approximately 20 Angstroms and approximately 80 Angstroms. In some embodiments, the etching process may be performed by forming a masking layer (not shown) over the planarization layer 604 and subsequently exposing unmasked areas of the planarization layer 604 to an etchant 606. In some embodiments, the etching process involves performing an etch back process to remove the planarization layer 604.

As shown in cross-sectional view 600c of FIG. 6C, a thickness of the second dielectric 602 is increased. The thickness of the second dielectric layer is increased by forming an additional material onto the second dielectric 602. The additional material is the same as a material used to form the second dielectric 602. In some embodiments, the additional material may comprise a tetra-ethyl-ortho-silicate (TEOS). In some embodiments, the additional material causes the second dielectric 602 to have a thickness of 350 Angstroms or within a range of between approximately 300 Angstroms and approximately 400 Angstroms. The additional material fills the open space in the trough 141. A lowermost surface of the second dielectric 602 is above an uppermost surface of the second ILD layer 502 and the first dielectric 504. The second dielectric 602 comprises sidewalls and a bottom surface that defines a second trough 610. An upper surface of the second dielectric 602 defining the second trough 610 is above the upper most surface of the second ILD layer 502 and the first dielectric 504.

Alternatively, as shown in cross-sectional view 700a of FIG. 7A, a second dielectric 602 is formed over the first dielectric 504. In some embodiments, the second dielectric 602 may comprise a tetra-ethyl-ortho-silicate (TEOS) layer formed to a thickness of 450 Angstroms or within a range of between approximately 400 Angstroms and approximately 500 Angstroms. The second dielectric 602 fills the remaining open portion of the trough 141. A planarization layer 604 is formed over the second dielectric 602. In some embodiments, the planarization layer 604 may comprise an anti-reflective coating (ARC). The second dielectric 602 comprises sidewalls and a bottom surface that define a second trough 610. In some embodiments, the planarization layer 604 is formed to a thickness of 880 Angstroms or in a range of approximately 700 Angstroms and 1100 Angstroms.

As shown in cross-sectional view 700b of FIG. 7B, an etching process is performed to etch the second ILD layer 502, the first dielectric 504, the second dielectric 602, and the planarization layer 604. The planarization layer 604 is removed from the embedded memory region 201a and logic region 201b. The etching process removes the second trough 610. In some embodiments, the etching process reduces a thickness of the second dielectric 602, so that the second dielectric 602 has a thickness of 50 Angstroms or within a range of between approximately 20 Angstroms and approximately 400 Angstroms. In some embodiments, the etching process may be performed by forming a masking layer (not shown) over the planarization layer 604 and subsequently exposing unmasked areas of the planarization layer 604 to an etchant 702. In some embodiments, the etching process involves performing an etch back process to remove the planarization layer 604.

Figure 8:
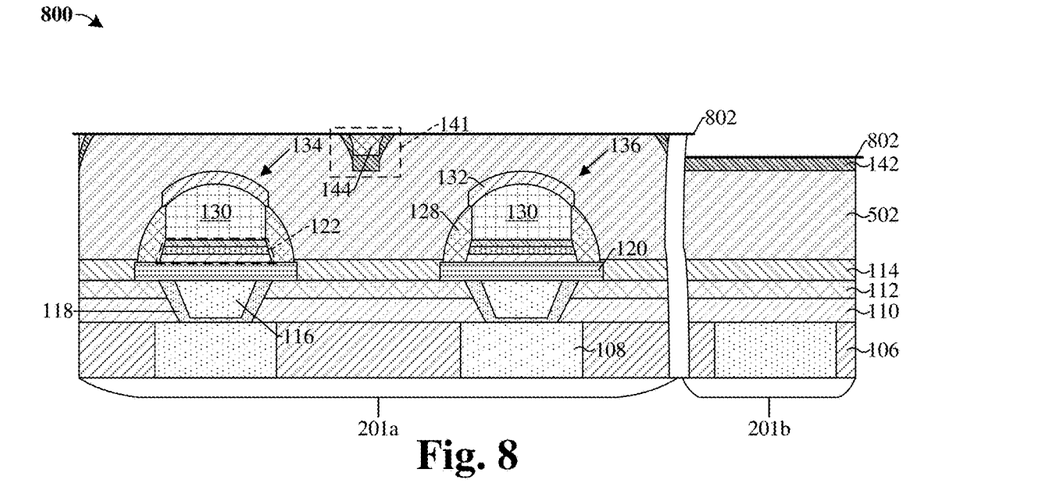

As shown in cross-sectional view 800 of FIG. 8, a chemical mechanical planarization (CMP) process is preformed along line 802. In the first embodiment of the method shown in FIGS. 6A-6C, the CMP process removes the second trough 610, a portion of the second ILD layer 502, the first dielectric 504, and the second dielectric 602 (e.g., 610, 502, 504, and 602 of FIG. 6C) and defines a first upper dielectric layer 142 and a second upper dielectric layer 144. In the second embodiment of the method shown in FIGS. 7A-7B, the CMP process removes a portion of the second ILD layer 502, the first dielectric 504, and the second dielectric 602 (e.g., 502, 504, and 602 of FIG. 7b) and defines a first upper dielectric layer 142 and a second upper dielectric layer 144. Within the logic region 201b, the second dielectric 602 is removed and a top surface of the first upper dielectric layer 142 is exposed. In some embodiments, the second upper dielectric layer 144 has a thickness of 35 Angstroms or within a range of approximately 10 Angstroms and 70 Angstroms. In some embodiments, the CMP process may reduce a thickness of the first upper dielectric layer 142. For example, the CMP process may reduce a thickness of the first upper dielectric layer 142 by approximately 25% or greater (e.g., from a thickness of 200 Angstroms to a thickness of 150 Angstroms). After the CMP process, the first upper dielectric layer 142 may have a thickness in a range of approximately 75 Angstroms and 225 Angstroms.

Figure 9:
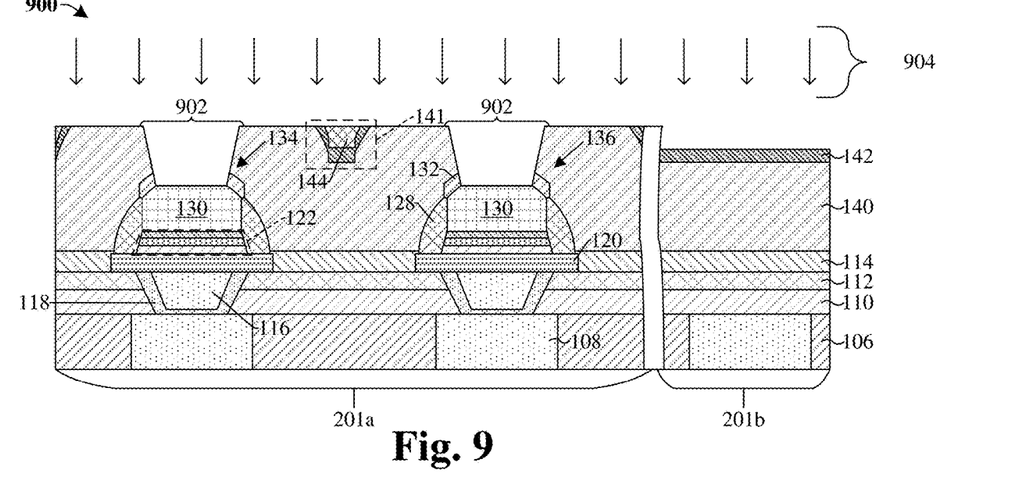

As shown in cross-sectional view 900 of FIG. 9, an etching process is performed to etch the second ILD layer (502 of FIG. 8), defining a second ILD layer 140. The etching process defines a hole 902 that is defined by top electrode via sidewalls within the second ILD layer 140 directly above the upper electrode 130. In some embodiments, the etching process may be performed by forming a masking layer (not shown) over the second ILD layer 140 and subsequently exposing unmasked areas of the second ILD layer 140 to an etchant 904. In some embodiments, the etching process may reduce a thickness of the first upper dielectric layer 142. For example, the etching process may reduce a thickness of the first upper dielectric layer 142 by approximately 33% or more (e.g., from approximately 150 Angstroms to less than 100 Angstroms).

In some embodiments, the masking layer (not shown) includes a photoresist mask. In other embodiments, the masking layer may comprise a hardmask layer (e.g., comprising a nitride layer). In some embodiments, the masking layer may comprise a multi-layer hard mask. For example, in some embodiments, the masking layer may comprise a tri-layer resist technology having a photoresist over silicon-containing hardmask over a spin-on carbon.

Figure 10:
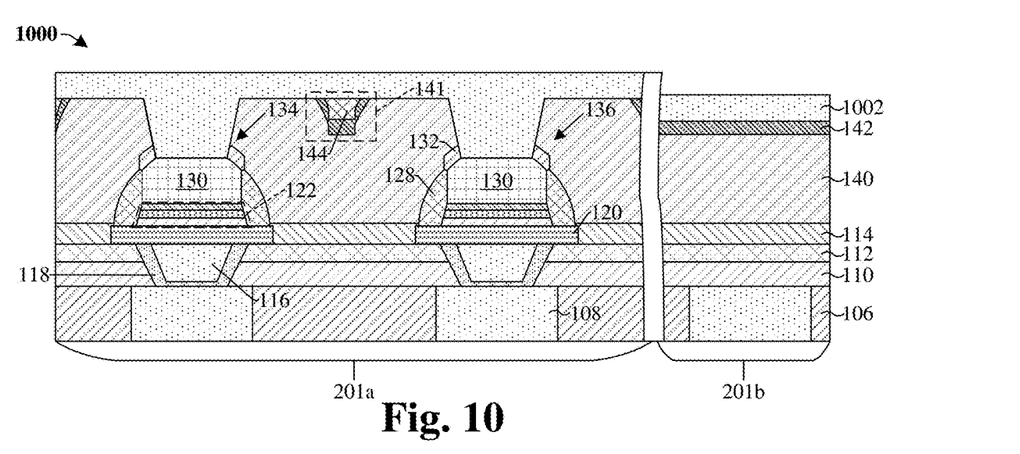

As shown in cross-sectional view 1000 of FIG. 10, a top electrode via layer 1002 is formed over the embedded memory region 201*a* and logic region 201*b*. The top electrode via layer 1002 fills the hole (902 of FIG. 9). In some embodiments, the top electrode via layer 1002 may comprise a conductive material, such as, titanium nitride, tantalum nitride, titanium, tantalum, or a combination of one or more of the foregoing.

Figure 11:
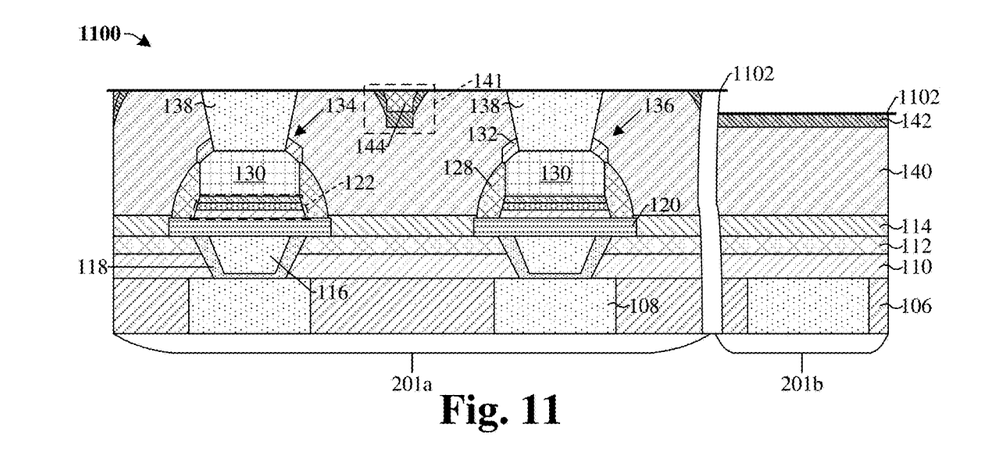

As shown in cross-sectional view 1100 of FIG. 11, a CMP process is performed along a line 1102. The CMP process removes a portion of the top electrode via layer (1002 of FIG. 10) defining a top electrode via 138. A top surface of the top electrode via 138, the second ILD layer 140, the first upper dielectric layer 142, and the second upper dielectric layer 144 are defined along a horizontal line. In some embodiments, the horizontal line is substantially level. In some embodiments, the top surface of the first upper dielectric layer 142 within the embedded memory region 201*a* is defined by a second height and a top surface of the first upper dielectric layer 142 within the logic region 201*b* is defined by a first height. In some embodiments, the second height is greater than the first height. In some embodiments, the second height is greater than the first height by a range of between approximately 900 Angstroms and approximately 1100 Angstroms. In some embodiments, the CMP process may reduce a thickness of the second upper dielectric layer 144. For example, after the CMP process, the second upper dielectric layer 144 may have a thickness of 20 Angstroms or within a range of approximately 5 Angstroms and 70 Angstroms.

Figure 12:
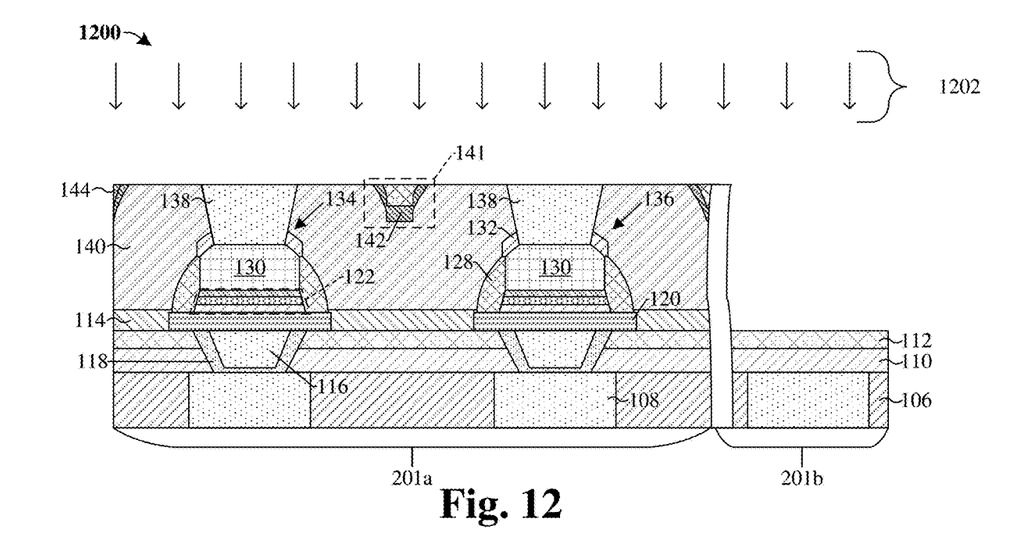

As shown in cross-sectional view 1200 of FIG. 12, an etch process is performed to remove the first upper dielectric layer 142, the second ILD layer 140, and the third lower dielectric layer 114 within the logic region 201*b*. The etching process involves exposing the first upper dielectric layer 142, the second ILD layer 140, and the third lower dielectric layer 114 within the logic region 201*b* to an etchant 1202. In some embodiments before performing the etch process, a masking layer is formed over the embedded memory region 201*a* (now shown).

Figure 13:
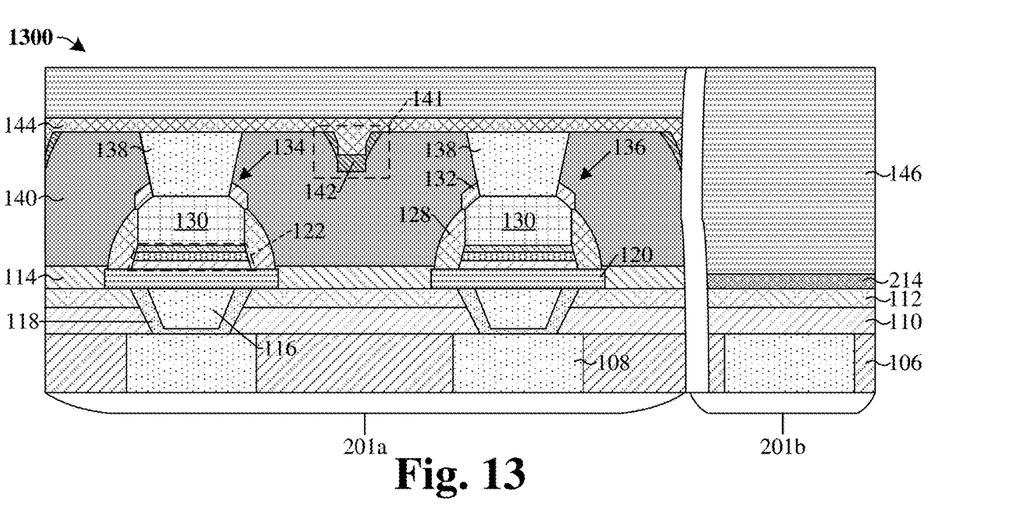

As shown in cross-sectional view 1300 of FIG. 13, a fourth lower dielectric layer 214 is formed over the second lower dielectric layer 112. Additional dielectric material is formed over the second upper dielectric layer 144, so as to increase a thickness of the second upper dielectric layer 144. In some embodiments, the additional dielectric material comprises the same material as the second upper dielectric layer 144 and increases the thickness of the second upper dielectric layer 144 by a range of 50 Angstroms and 250 Angstroms. A third ILD layer 146 is formed over the fourth lower dielectric layer 214 and the second upper dielectric layer 144.

Figure 14:
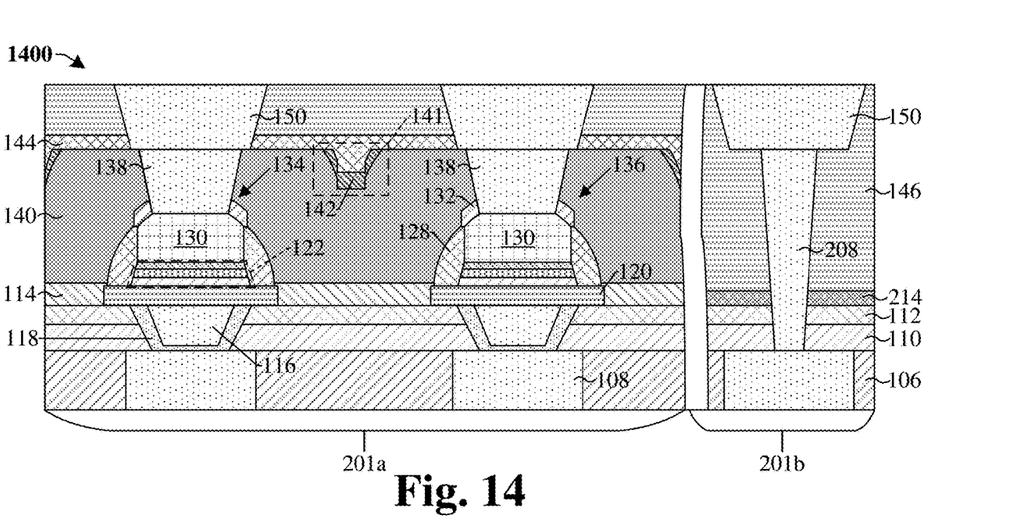

As shown in cross-sectional view 1400 of FIG. 14, a first conductive via 208 is formed over the interconnect wire 108 within the logic region 201*b* and extends through the first lower dielectric layer 110, the second lower dielectric layer 112, the fourth lower dielectric layer 214, and a portion of the third ILD layer 146. A second conductive wire 150 is formed over the first conductive via 208 within the logic region 201*b* and over the top electrode via 138. The second conductive wire 150 is surrounded by the third ILD layer 146. Within the embedded memory region 201*a*, the second conductive wire 150 extends through the second upper dielectric layer 144.

Figure 15:
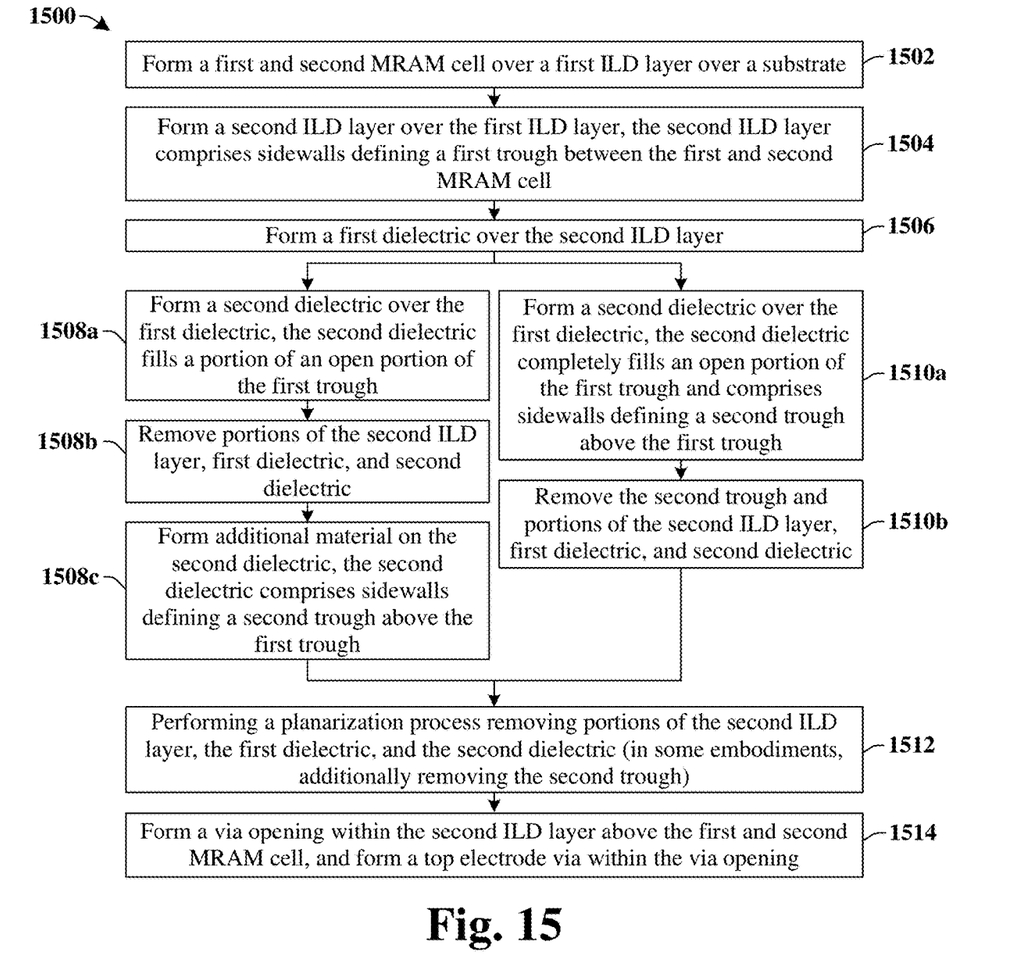
FIG. 15 illustrates a methodology in flowchart format that illustrates some embodiments of a method of forming a memory device including two MRAM cells, according to the present disclosure.

FIG. 15 illustrates a method 1500 of forming a memory device in accordance with some embodiments. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1502, first and second MRAM cells are formed over a first ILD layer over a substrate. FIG. 4 illustrates a cross-sectional view 400 corresponding to some embodiments of act 1502.

At 1504, a second ILD layer is formed over the first ILD layer, the second ILD layer comprises sidewalls defining a first trough between the first and second MRAM cells. FIG. 5 illustrates a cross-sectional view 500 corresponding to some embodiments of act 1504.

At 1506, a first dielectric is formed over the second ILD layer. FIG. 5 illustrates a cross-sectional view 500 corresponding to some embodiments of act 1506.

At 1508*a*, a second dielectric is formed over the first dielectric, the second dielectric fills a portion of an open portion of the first trough. FIG. 6A illustrates a cross-sectional view 600*a* corresponding to some embodiments of act 1508*a*.

At 1508*b*, portions of the second ILD layer, the first dielectric, and the second dielectric are removed. FIG. 6B illustrates a cross-sectional view 600*b* corresponding to some embodiments of act 1508*b*.

At 1508*c*, a thickness of the second dielectric is increased. Increase the thickness of the second dielectric causes the second dielectric to have sidewalls defining a second trough above the first trough. FIG. 6C illustrates a cross-sectional view 600*c* corresponding to some embodiments of act 1508*c*.

At 1510*a*, a second dielectric is formed over the first dielectric, the second dielectric completely fills an open portion of the first trough and comprises sidewalls defining a second trough above the first trough. FIG. 7A illustrates a cross-sectional view 700*a* corresponding to some embodiments of act 1510*a*.

At 1510*b*, the second trough and portions of the second ILD layer, first dielectric, and second dielectric are removed. FIG. 7B illustrates a cross-sectional view 700*b* corresponding to some embodiments of act 1510*b*.

At 1512, a planarization process was performed to remove portions of the second ILD layer, the first dielectric, and the second dielectric, in some embodiments, the planarization process removes the second trough. FIG. 8 illustrates a cross-sectional view 800 corresponding to some embodiments of act 1512.

At 1514, a via opening is formed within the second ILD layer, above the first and second MRAM cells, and a top electrode via is formed within the via opening. FIG. 9 and FIG. 11 illustrate cross-sectional views 900 and 1100 corresponding to some embodiments of act 1514.

Accordingly, in some embodiments, the present disclosure relates to a method of forming a pair of MRAM cells that comprises forming an ILD between the cells, the ILD comprising sidewalls that defines a trough where the trough contains one or more dielectric material and no metal material.

In some embodiments, the present disclosure relates to a memory device. The memory device includes a first magnetoresistive random-access memory (MRAM) cell disposed over a substrate; a second MRAM cell disposed over the substrate; an inter-level dielectric (ILD) layer disposed over the substrate, the ILD layer comprises sidewalls defining a trough between the first MRAM cell and the second MRAM cell; a dielectric layer disposed over the ILD layer, the dielectric layer fills the trough.

In other embodiments, the present disclosure relates to a memory device. The memory device includes a first magnetoresistive random-access memory (MRAM) cell disposed over a substrate; a second MRAM cell disposed over the substrate; an inter-level dielectric (ILD) layer disposed over the first MRAM cell and the second MRAM cell, the ILD layer defines a recess between the first MRAM cell and the second MRAM cell, the ILD layer is comprised of a first material; a dielectric layer disposed over the ILD layer, a bottom surface of the dielectric layer directly contacts an upper surface of the ILD layer defining the recess, the dielectric layer is comprised of a second material; a second ILD layer disposed over the dielectric layer, the recess comprises the first and second material between a lower surface of the recess and a lower surface of the second ILD layer.

In yet other embodiments, the present disclosure relates to a method for manufacturing a memory device. The method includes forming a first magnetoresistive random-access memory (MRAM) cell over a substrate; forming a second MRAM cell over the substrate; forming an inter-level dielectric (ILD) layer over the substrate, the ILD layer comprises sidewalls defining a first trough between the first MRAM cell and the second MRAM cell; forming a dielectric layer over the ILD layer, the dielectric layer comprises sidewalls defining a second trough directly above the first trough; removing the second trough, a portion of the ILD layer, and a portion of the dielectric layer, an upper surface of the ILD layer and an upper surface of the dielectric layer meet at a horizontal line, the horizontal line is substantially level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
   forming a first memory cell over a substrate;
   forming a second memory cell over the substrate;
   forming an inter-level dielectric (ILD) layer over the substrate such that the ILD layer comprises sidewalls defining a first trough between the first memory cell and the second memory cell; and
   forming a first dielectric layer over the ILD layer and within the first trough.

2. The method of claim 1, further comprising:
   depositing a second dielectric layer over the first dielectric layer, wherein the second dielectric layer comprises opposing sidewalls defining a second trough over the first trough.

3. The method of claim 2, wherein the ILD layer comprises a first dielectric material, the first dielectric layer comprises a second dielectric material, and the second dielectric layer comprises a third dielectric material, wherein the first dielectric material, the second dielectric material, and the third dielectric material are different from one another.

4. The method of claim 2, further comprising:
   performing an etch back process on the ILD layer, the first dielectric layer, and the second dielectric layer;
   performing a first deposition of additional dielectric material over the second dielectric layer, wherein the additional dielectric material and the second dielectric layer comprise a same material such that a thickness of the second dielectric layer is increased;
   performing a planarization process into the second dielectric layer, thereby removing the second trough and reducing the thickness of the second dielectric layer; and
   performing a second deposition of the additional dielectric material over the second dielectric layer, thereby increasing the thickness of the second dielectric layer, wherein the second dielectric layer extends along an upper surface of the ILD layer.

5. The method of claim 4, wherein after the first deposition and before the planarization process, the second dielectric layer comprises an upper surface extending between the opposing sidewalls, thereby defining a bottom surface of the second trough, wherein the upper surface of the second dielectric layer is disposed above a top surface of the ILD layer.

6. The method of claim 4, prior to performing the second deposition, further comprising:
   forming top electrode vias over the first memory cell and the second memory cell, respectively, wherein a top surface of the top electrode vias and a top surface of the ILD layer are aligned.

7. The method of claim 2, wherein the opposing sidewalls of the second dielectric layer meet at a point, wherein the point defines a bottom surface of the second trough, and wherein the point is vertically above the first trough.

8. The method of claim 7, further comprising:
   performing an etch back process on the ILD layer, the first dielectric layer, and the second dielectric layer, wherein the etch back process removes the second trough; and performing a planarization process into the second dielectric layer, thereby reducing a thickness of the ILD layer, the first dielectric layer, and the second dielectric layer; and performing a first deposition of additional dielectric material over the second dielectric layer, wherein the additional dielectric material and the second dielectric layer comprise a same material such that a thickness of the second dielectric layer is increased.

9. The method of claim 1, wherein forming the ILD layer includes:
depositing the ILD layer over the first and second memory cells, such that the ILD layer comprises a first curved upper surface over the first memory cell and a second curved upper surface over the second memory cell;
performing a removal process to remove the first and second curved upper surfaces over the first and second memory cells; and
performing a planarization process into the ILD layer, thereby reducing a thickness of the ILD layer.

10. A method for manufacturing a memory device, comprising:
forming a first magnetoresistive random-access memory (MRAM) cell over a substrate;
forming a second MRAM cell over the substrate;
forming an inter-level dielectric (ILD) layer over the substrate, wherein the ILD layer comprises sidewalls defining a first trough between the first MRAM cell and the second MRAM cell;
forming a dielectric layer over the ILD layer, wherein the dielectric layer comprises sidewalls defining a second trough above the first trough; and
removing the second trough, a portion of the ILD layer, and a portion of the dielectric layer, wherein an upper surface of the ILD layer and an upper surface of the dielectric layer are aligned.

11. The method of claim 10, prior to removing the second trough, further comprising:
performing a first etch process to remove a portion of the ILD layer and a portion of the dielectric layer, wherein the first etch process defines a second upper surface of the ILD layer and a second upper surface of the dielectric layer; and
filling the second trough with a first material, wherein the first material is a same material as a material the dielectric layer is comprised of, wherein an upper surface of the first material is above the second upper surface of the ILD layer and the second upper surface of the dielectric layer.

12. The method of claim 10, wherein the ILD layer comprises a first dielectric material, wherein the dielectric layer comprises a second dielectric material, and wherein the first dielectric material is a different material than the second dielectric material.

13. The method of claim 10, further comprising:
performing a first etch process to define a first via opening above the first MRAM cell and a second via opening above the second MRAM cell;
forming a top electrode via layer over the first and second MRAM cell; and
performing a second planarization process removing a portion of the top electrode via layer, defining a first top electrode via above the first MRAM cell and a second top electrode via above the second MRAM cell, wherein no portion of the top electrode via layer exists above a top surface of the first trough.

14. The method of claim 13, wherein outer sidewalls of the first top electrode via are within outer sidewalls of the first MRAM cell, wherein outer sidewalls of the second top electrode via are within outer sidewalls of the second MRAM cell.

15. The method of claim 10, wherein the upper surface of the ILD layer and the upper surface of the dielectric layer meet at a horizontal line, wherein the horizontal line is substantially level.

16. A method for manufacturing a memory device, comprising:
forming a memory cell over a substrate and within an embedded memory region;
forming a first inter-level dielectric (ILD) layer over the substrate, wherein the first ILD layer comprises sidewalls defining a trough;
forming a first dielectric layer over the first ILD layer, wherein the first dielectric layer lines the trough;
forming a conductive structure over the memory cell, wherein the trough is laterally offset from the conductive structure by a non-zero distance; and
forming a second dielectric layer along an upper surface of the first ILD layer such that the second dielectric layer comprises a protrusion that extends below a top surface of the first ILD layer and is disposed within the trough.

17. The method of claim 16, after forming the conductive structure, further comprising:
performing an etch process on a logic region that is laterally adjacent to the embedded memory region to remove the ILD layer and the first dielectric layer from the logic region.

18. The method of claim 17, further comprising:
depositing a second ILD layer over the embedded memory region and the logic region, wherein the second dielectric layer is disposed between the first ILD layer and the second ILD layer within the embedded memory region, and wherein a first thickness of the second ILD layer within the embedded memory region is less than a second thickness of the second ILD layer within the logic region.

19. The method of claim 16, further comprising:
forming a first conductive via and a first conductive wire over a lower interconnect wire within a logic region, wherein the logic region is laterally adjacent to the embedded memory region;
forming a second conductive wire over the conductive structure and within the embedded memory region, wherein a bottom surface of the second conductive wire is aligned with a bottom surface of the first conductive wire; and
wherein a bottom surface of the protrusion is disposed below the bottom surface of the first conductive wire.

20. The method of claim 19, wherein the second dielectric layer laterally surrounds the second conductive wire.

* * * * *